(12) United States Patent
Jo et al.

(10) Patent No.: US 12,278,625 B2
(45) Date of Patent: Apr. 15, 2025

(54) DRIVER CIRCUIT

(71) Applicant: Nippon Telegraph and Telephone Corporation, Tokyo (JP)

(72) Inventors: Teruo Jo, Tokyo (JP); Munehiko Nagatani, Tokyo (JP); Hideyuki Nosaka, Tokyo (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 78 days.

(21) Appl. No.: 18/005,938

(22) PCT Filed: Jul. 21, 2020

(86) PCT No.: PCT/JP2020/028253
§ 371 (c)(1),
(2) Date: Jan. 18, 2023

(87) PCT Pub. No.: WO2022/018823
PCT Pub. Date: Jan. 27, 2022

(65) Prior Publication Data
US 2023/0275581 A1      Aug. 31, 2023

(51) Int. Cl.
   H03K 17/687    (2006.01)
   H02H 9/04      (2006.01)
   H03F 1/56      (2006.01)
   H03F 3/45      (2006.01)
   H03K 17/0814   (2006.01)

(52) U.S. Cl.
   CPC .......... *H03K 17/687* (2013.01); *H02H 9/042* (2013.01); *H03F 1/56* (2013.01); *H03F 3/45179* (2013.01); *H03K 17/08142* (2013.01)

(58) Field of Classification Search
None
See application file for complete search history.

(56) References Cited

U.S. PATENT DOCUMENTS 5,650,652 A * 7/1997 Mizutani ............... H03F 1/523
                                                257/355
5,969,929 A   10/1999 Kleveland et al.
6,351,363 B1 * 2/2002 Wang ................... H01L 27/0255
                                                361/111

(Continued)

FOREIGN PATENT DOCUMENTS

JP   63001211 A   1/1988
JP   07226557 A   8/1995

(Continued)

OTHER PUBLICATIONS

Suzuki et al. "A Study of ESD Robustness of Cascoded NMOS Driver," 29th Electrical Overstress/Electrostatic Discharge Symposium(EOS/ESD), IEEE, Dec. 2007, 5 pages. As discussed in the specification.

*Primary Examiner* — Thomas J. Hiltunen
(74) *Attorney, Agent, or Firm* — Slater Matsil, LLP

(57) ABSTRACT

The driver circuit includes DC cut capacitors, an input buffer, input termination resistors connected in series between differential input signal terminals and an ESD protection circuit connected to a connection point of the input terminal resistors. The ESD protection circuit includes diodes.

8 Claims, 19 Drawing Sheets

(56) References Cited

U.S. PATENT DOCUMENTS

| | | | | |
|---|---|---|---|---|
| 6,738,248 | B1* | 5/2004 | Jenkins | H01L 27/0255 361/111 |
| 7,009,827 | B1* | 3/2006 | Lee | H04L 25/0272 361/91.1 |
| 7,355,476 | B2* | 4/2008 | Kasha | H04B 1/18 330/298 |
| 8,346,198 | B2* | 1/2013 | Kasha | H03F 3/45183 455/280 |
| 9,019,669 | B1* | 4/2015 | Ransijn | H02H 9/046 361/56 |
| 9,432,230 | B1* | 8/2016 | Chang | H04B 3/14 |
| 9,438,188 | B2* | 9/2016 | Li | H03F 3/45071 |
| 10,917,084 | B2* | 2/2021 | Lee | H03K 17/08 |
| 11,233,393 | B2* | 1/2022 | Nagatani | H04B 3/02 |
| 11,405,068 | B2* | 8/2022 | Kim | H04L 25/028 |
| 11,799,288 | B2* | 10/2023 | Uemura | H01L 27/0255 |
| 2003/0008463 | A1 | 1/2003 | Ohnakado et al. | |
| 2003/0117206 | A1* | 6/2003 | Ohnakado | H01L 27/0251 327/310 |
| 2004/0120092 | A1* | 6/2004 | Jaussi | H01L 27/0251 361/118 |
| 2006/0256489 | A1 | 11/2006 | Ker et al. | |
| 2010/0246078 | A1* | 9/2010 | Utagawa | H03F 3/45475 361/56 |
| 2011/0255201 | A1 | 10/2011 | Shimomura et al. | |
| 2019/0089150 | A1* | 3/2019 | Gharibdoust | H01F 29/02 |

FOREIGN PATENT DOCUMENTS

| | | |
|---|---|---|
| JP | 2000510653 A | 8/2000 |
| JP | 2003023101 A | 1/2003 |
| JP | 2010233140 A | 10/2010 |
| JP | 2011228372 A | 11/2011 |

* cited by examiner

DRIVER CIRCUIT

CROSS-REFERENCE TO RELATED APPLICATIONS

This application is a national phase entry of PCT Application No. PCT/JP2020/028253, filed on Jul. 21, 2020, which application is hereby incorporated herein by reference.

TECHNICAL FIELD

The present invention relates to a driver circuit for driving an optical modulator.

BACKGROUND

A modulator driver circuit used in a transmitter for optical communication is used to drive an optical modulator in the optical transmitter and serves to amplify the amplitude intensity of an electric signal to be transmitted to a level at which the optical modulator can be driven. Such a driver circuit is required to have a protection function for preventing a voltage equal to or higher than the breakdown voltage from being applied to a transistor used in the circuit.

As a countermeasure against the breakdown voltage when electro-static is applied, a method of adding an electro-static discharge (ESD) protection circuit composed of diodes to all the terminals to the outside of a driver circuit as shown in FIG. 17 is known (see NPL 1).

The driver circuit 100 drives a Mach-Zehnder optical modulator (MZM) 200 composed of an optical waveguide (not shown), electrodes 201 and 202 and resistors R200 and R201. The driver circuit 100 includes an input buffer 101, a gain control amplifier (GCA) 102, a preamplifier 103, an output circuit 104, DC cut capacitors C100 and C101, input termination resistors R100 and R101, and ESD protection circuits 105 and 106.

The ESD protection circuit 105 provided at differential input signal terminals Vinp and Vinn of the driver circuit 100 is composed of diodes D100 to D103. The ESD protection circuit 106 provided at differential output signal terminals Voutp and Voutn of the driver circuit 100 is composed of diodes D104 to D107.

FIG. 18 is a diagram showing a configuration of the output circuit 104. The output circuit 104 is composed of transistors Q100 to Q104.

In FIGS. 17 and 18, VCC is the power supply voltage of the driver circuit 100, VDR is the power supply voltage of the MZM 200, and VB1 and VB2 are bias voltages. The power supply voltage VDR of the MZM 200 is applied to the output signal terminal Voutp of the driver circuit 100 via a resistor R200 and an electrode 201. Similarly, a power supply voltage VDR is applied to an output signal terminal Voutn of the driver circuit 100 via a resistor R201 and an electrode 202.

During the normal operation of the driver circuit 100, the diodes D100 to D103, D104 to D107 of the ESD protection circuits 105 and 106 are in an off state without flowing a current.

On the other hand, when a voltage higher than the power supply voltage VCC is applied to the input signal terminals Vinp and Vinn of the driver circuit 100, a current flows from the input terminals Vinp and Vinn to the power supply voltage VCC side via the diodes D100 and D102, thereby transistors of the driver circuit 100 are protected. In addition, when a voltage lower than the ground is applied to the input signal terminals Vinp and Vinn, a current flows from ground to the input signal terminals Vinp and Vinn via the diodes D101 and D103, thereby transistors of the driver circuit 100 are protected.

Similarly, when a voltage higher than the power supply voltage VCC is applied to the output signal terminals Voutp and Voutn of the driver circuit 100, a current flows from the output signal terminals Voutp and Voutn to the power supply voltage VCC side via the diodes D104 and D106, thereby transistors of the driver circuit 100 are protected. In addition, when a voltage lower than the ground is applied to the output signal terminals Voutp and Voutn, a current flows from ground to the output signal terminals Voutp and Voutn via the diodes D105 and D107, thereby transistors of the driver circuit 100 are protected.

However, in the conventional driver circuit 100, the parasitic capacitance of the diode D100 to D103, D104 to D107 of the ESD protection circuit 105,106 provided for protecting the driver circuit 100 from electro-static is large, and the parasitic capacitance is added to the input/output signal terminals of the driver circuit 100, thereby the band of the driver circuit 100 is greatly deteriorated.

CITATION LIST

Non Patent Literature

[NPL 1] Teruo Suzuki, et al., "A study of ESD robustness of cascoded NMOS driver", 2007 29th Electrical Overstress/Electrostatic Discharge Symposium (EOS/ESD), IEEE, 2007

SUMMARY

Technical Problem

Embodiments of the present invention have been made to solve the above problem and an object of embodiments of the present invention is to provide a driver circuit that has an electro-static protection function and can achieve a wider frequency band than before.

Solution to Problem

A driver circuit (a first example) of embodiments of the present invention includes a first capacitor having one end connected to a first input signal terminal on a positive phase side of the driver circuit, a second capacitor having one end connected to a second input signal terminal on a negative phase side of the driver circuit, an input buffer having a non-inverted input terminal connected to another end of the first capacitor and an inverted input terminal connected to another end of the second capacitor, first and second input termination resistors connected in series between the first input signal terminal and the second input signal terminal, and an ESD protection circuit connected to a connection point of the first and second input termination resistors, and the ESD protection circuit includes a first diode having an anode connected to the connection point of the first and second input termination resistors and a cathode connected to a power supply voltage and a second diode having an anode connected to ground and a cathode connected to the connection point of the first and second input termination resistors.

The driver circuit (a third example) of embodiments of the present invention includes an ESD protection circuit connected to a first input signal terminal on the positive phase side and a second input signal terminal on the negative phase side of the driver circuit, first and second capacitors having one ends connected to the ESD protection circuit, and an input buffer having a non-inverting input terminal connected to another end of the first capacitor and an inverting input terminal connected to another end of the second capacitor, and the ESD protection circuit includes a first transmission line having an input end connected to the first input signal terminal and an output end connected to one end of the first capacitor, a second transmission line having an input end connected to the second input signal terminal and an output end connected to one end of the second capacitor, a plurality of first input termination resistors arranged along the first transmission line and having one end connected to the first transmission line, a plurality of second input termination resistors arranged along the second transmission line and having one end connected to the second transmission line and another end connected to another end of the first input termination resistor, a plurality of first diodes provided for each pairs of the first and second resistors connected in series and having anodes connected to the connection points of the first and second input termination resistors and cathodes connected to the power supply voltage, and a plurality of second diodes provided for each of the first diodes having anodes connected to ground and cathodes connected to anodes of the first diodes.

The driver circuit (a fourth example) of embodiments of the present invention includes an ESD protection circuit connected to a first input signal terminal on the positive phase side and a second input signal terminal on the negative phase side of the driver circuit, first and second capacitors having one ends connected to the ESD protection circuit, and an input buffer having a non-inverting input terminal connected to another end of the first capacitor and an inverting input terminal connected to another end of the second capacitor, and the ESD protection circuit includes a first transmission line having an input end connected to the first input signal terminal and an output end connected to one end of the first capacitor, a second transmission line having an input end connected to the second input signal terminal and an output end connected to one end of the second capacitor, a plurality of first input termination resistors arranged along the first transmission line and having one end connected to the first transmission line, a plurality of second input termination resistors arranged along the second transmission line and having one end connected to the second transmission line and another end connected to another end of the first input termination resistor, a plurality of first diodes provided for every other set of a plurality of sets of the first and second input termination resistors connected in series and having anodes connected to the connection points of the first input termination resistor and the second input termination resistor and cathodes connected to the power supply voltage, and a plurality of second diodes having anodes connected to ground and cathodes connected to the connection points of the first input termination resistor and the second input termination resistor to which the first diodes are not connected among a plurality of sets of the first and second input termination resistor.

The driver circuit (a fifth example) of embodiments of the present invention includes an ESD protection circuit connected to a first input signal terminal on a positive phase side and a second input signal terminal on a negative phase side of the driver circuit, first and second capacitors having one ends connected to the ESD protection circuit, and an input buffer having a non-inverting input terminal connected to another end of the first capacitor and an inverting input terminal connected to another end of the second capacitor, and the ESD protection circuit includes a first transmission line having an input end connected to the first input signal terminal and an output end connected to one end of the first capacitor, a second transmission line having an input end connected to the second input signal terminal and an output end connected to one end of the second capacitor, first and second input termination resistors connected in series between the output end of the first transmission line and the output end of the second transmission line, a plurality of first diodes arranged along the first transmission line and having anodes connected to the first transmission line and cathodes connected to the power supply voltage, a plurality of second diodes provided for each of the first diodes and having anodes connected to ground and cathodes connected to anodes of the first diodes, a plurality of third diodes arranged along the second transmission line and having anodes connected to the second transmission line and cathodes connected to the power supply voltage, and a plurality of fourth diodes provided for each of the third diodes and having anodes connected to ground and cathodes connected to the anodes of the third diodes.

The driver circuit (a sixth example) of embodiments of the present invention includes an ESD protection circuit connected to a first input signal terminal on a positive phase side and a second input signal terminal on a negative phase side of the driver circuit, first and second capacitors having one ends connected to the ESD protection circuit, and an input buffer having a non-inverting input terminal connected to another end of the first capacitor and an inverting input terminal connected to another end of the second capacitor, and the ESD protection circuit includes a first transmission line having an input end connected to the first input signal terminal and an output end connected to one end of the first capacitor, a second transmission line having an input end connected to the second input signal terminal and an output end connected to one end of the second capacitor, first and second input termination resistors connected in series between an output end of the first transmission line and an output end of the second transmission line, a plurality of first diodes arranged along the first transmission line and having anodes connected to the first transmission line and cathodes connected to the power supply voltage, a plurality of second diodes provided for each of the first diodes and having anode connected to ground and cathodes connected to the first transmission line, a plurality of third diodes arranged along the second transmission line and having anodes connected to the second transmission line and cathodes connected to the power supply voltage, and a plurality of fourth diodes provided for each of the third diodes and having anodes connected to ground and cathodes connected to the second transmission line, and the first diodes and the second diodes are alternately arranged to be connected to different points of the first transmission line, and the third diodes and the fourth diodes are alternately arranged to be connected to different points of the second transmission line.

The driver circuit (a first example) of embodiments of the present invention includes an output circuit having a non-inverted output terminal connected to a first output signal terminal on the positive phase side of the driver circuit and an inverted output terminal connected to a second output signal terminal on the negative phase side of the driver circuit, and a first ESD protection circuit connected to the first and second output signal terminals, and the first ESD protection circuit includes a first diode having an anode connected to the first output signal terminal and a cathode connected to a power supply voltage and a second diode having an anode connected to the second output signal terminal and a cathode connected to the power supply voltage, and the output circuit includes first and second transistors having base terminals to which a differential signal for driving the optical modulator is input, a third transistor having collector terminal connected to the first output signal terminal and emitter terminal connected to the collector terminal of the first transistor, the fourth transistor having collector terminal connected to the second output signal terminal and emitter terminal connected to the collector terminal of the second transistor, and the second ESD protection circuit connected to the base terminals of the third and fourth transistors, and the second ESD includes a third diode having a anode connected to ground and a cathode connected to the base terminal of the third transistor and a fourth diode having an anode connected to ground and a cathode connected to the base terminal of the fourth transistor.

The driver circuit (a second example) of embodiments of the present invention includes an output circuit in which a non-inverted output terminal is connected to a first output signal terminal on the positive phase side of the driver circuit and an inverted output terminal is connected to a second output signal terminal on the negative phase side of the driver circuit, and a first ESD protection circuit connected between the first output signal terminal and the second output signal terminal of the output circuit, and the first ESD protection circuit includes a first transmission line having an input end connected to the non-inverted output terminal and an output terminal connected to the first output signal terminal of the output circuit, a second transmission line having an input end connected to the inverted output terminal and an output end connected to the second output signal terminal of the output circuit, a plurality of first diodes arranged along the first transmission line and having anodes connected to the first transmission line and cathodes connected to the power supply voltage, a plurality of second diodes arranged along the second transmission line and having anodes connected to the second transmission line and cathodes connected to the power supply voltage, and the output circuit includes first and second transistors having base terminals which receive a differential signal for driving the optical modulator, a third transistor having a collector terminal connected to the first output signal terminal and an emitter terminal connected to the collector terminal of the first transistor, a fourth transistor having a collector terminal connected to the second output signal terminal and an emitter terminal connected to the collector terminal of the second transistor, and a second ESD protection circuit connected to base terminals of the third and fourth transistors, and the second ESD protection circuit includes a third diode having an anode connected to ground and a cathode connected to a base terminal of the third transistor and a fourth diode having an anode connected to ground and an cathode connected to the base terminal of the fourth transistor.

Advantageous Effects of Embodiments of Invention

According to embodiments of the present invention, an ESD protection circuit is provided at a connection point of first and second input termination resistors connected in series between first and second input signal terminals of a driver circuit, the ESD protection circuit includes first and second diodes, so that a wider frequency band than before can be realized while having an electro-static protection function.

In embodiments of the present invention, an ESD protection circuit is also provided to be connected to the first and second input signal terminals of the driver circuit, and the ESD protection circuit includes first and second transmission lines, first and second input termination resistors, and first and second diodes, so that a wider frequency band than before can be realized while having an electro-static protection function.

In embodiments of the present invention, an ESD protection is also provided circuit to be connected to the first and second input signal terminals of the driver circuit, and the ESD protection circuit includes first and second transmission lines, first and second input termination resistors, and first, second third, and fourth diodes, so that a frequency band wider than before can be realized while having an electro-static protection function.

In addition, a first ESD protection circuit connected to the first and second output signal terminals of the driver circuit is provided, the first ESD protection circuit includes first and second diodes, an output circuit includes first, second, third and fourth transistors and a second ESD protection circuit, and the second ESD protection circuit includes third and fourth diodes, so that a wider frequency band than before can be realized while having an electro-static protection function.

In addition, a first ESD protection circuit connected to the first and second output signal terminals of the driver circuit is provided, the first ESD protection circuit includes first and second transmission lines and first and second diodes, an output circuit includes first, second, third and fourth transistor and a second ESD protection circuit, and the second ESD protection circuit includes third and fourth diodes, so that a wider frequency band than before can be realized while having an electro-static protection function.

DETAILED DESCRIPTION OF ILLUSTRATIVE EMBODIMENTS

First Example

Figure 1:
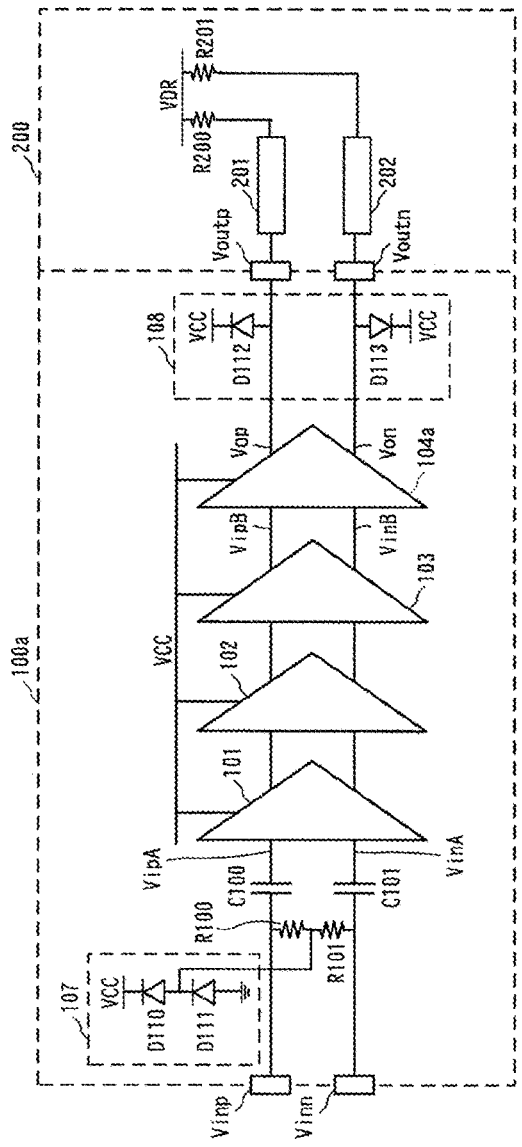
FIG. 1 is a circuit diagram showing a configuration of a driver circuit according to a first example of the present invention.

Hereinafter, an example of the present invention will be described with reference to the drawings. FIG. 1 is a circuit diagram shoeing a configuration of a driver circuit according to the first example of the present invention. The driver circuit 100a of the present example includes an input buffer 101 to which a differential signal for driving the MZM 200 is input, a GCA 102 for adjusting a gain so that the amplitude of the differential signal output from the input buffer 101 becomes constant, a preamplifier 103 for amplifying the differential signal output from the GCA 102, an output circuit 104a of open collector type for driving the MZM 200 corresponding to the differential signal output from the preamplifier 103, a DC cut capacitor C100 having one end connected to an input signal terminal Vinp on the positive phase side of the driver circuit 100a and another end connected to a non-inverting input terminal VipA of the input buffer 101, a DC cut capacitor C101 having one end connected to a input signal terminal Vinn on the negative phase of the driver circuit 100a and another end connected to a non-inverted input terminal VinA of the input buffer 101, two input termination resistors R100 and R101 connected in series between the input signal terminals Vinp and Vinn, an ESD protection circuit 107 connected to a connection point of the input termination resistors R100 and R101, and an ESD protection circuit 108 connected to the output signal terminals Voutp and Voutn. The resistance value of each of the input termination resistors R100 and R101 is 50Ω.

The ESD protection circuit 107 includes a diode D110 having an anode connected to a connection point of the input termination resistors R100 and R101 and a cathode connected to a power supply voltage VCC, and a diode D111 having a anode connected to ground and a cathode connected to the connection point of the input termination resistors R100 and R101.

The ESD protection circuit 108 includes a diode D112 having an anode connected to an output signal terminal Voutp on the positive phase side of the driver circuit 100a and a cathode connected to the power supply voltage VCC, and a diode D113 having an anode connected to an output signal terminal Voutn on the negative phase side of the driver circuit 100a and a cathode connected to the power supply voltage VCC.

Figure 2:
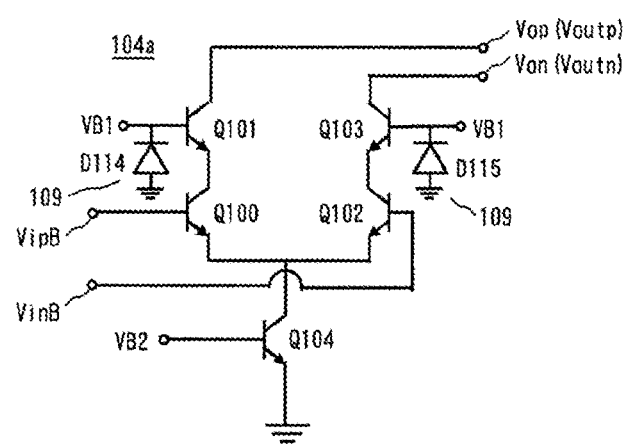
FIG. 2 is a circuit diagram showing a configuration of an output circuit of the driver circuit according to the first example of the present invention.

FIG. 2 is a circuit diagram showing the configuration of the output circuit 104a of the driver circuit 100a. The output circuit 104a includes an input transistor Q100 having base terminal connected to a non-inverting input terminal VipB of the output circuit 104a, an output transistor Q101 having base terminal connected to a bias voltage VB1, collector terminal connected to a non-inverting output terminal Vop of the output circuit 104a, and emitter terminal connected to the collector terminal of the input transistor Q100, an input transistor Q102 having base terminal connected to the inverted input terminal VinB of the output circuit 104a, an output transistor Q103 having base terminal connected to the bias voltage VB1, collector terminal connected to the inverted output terminal Von of the output circuit 104a, and emitter terminal connected to the collector terminal of the input transistor Q102, an current source transistor Q104 having base terminal connected to a bias voltage VB2, collector terminal connected to the emitter terminal of the input transistors Q100 and Q102, and emitter terminal connected to ground, a diode D114 having a node connected to ground and a cathode connected to the base of the output transistor Q101, and a diode D115 having an anode connected to ground and a cathode connected to the base terminal of the output transistor Q103.

The diodes D114 and D115 constitute an ESD protection circuit 109. The power supply voltage VCC of the driver circuit 100a, the power supply voltage VDR of the MZM 200, and the bias voltages VB1 and VB2 (VCC≥VB1>VB2) are positive voltages.

In the present example, the ESD protection circuit 107 is connected to the middle point of the input termination resistors R100 and R101 as shown in FIG. 1 in order to protect the driver circuit 100a from electro-static.

When a positive voltage higher than the power supply voltage VCC is applied to the input signal terminal Vinp, a current flows from the input signal terminal Vinp to the power supply voltage VCC side via the input termination resistor R100 and the diode D110. Similarly, when a positive voltage higher than the power supply voltage VCC is applied to the input signal terminal Vinn, a current flows from the input signal terminal Vinn to the power supply voltage VCC side via the input termination resistor R101 and a diode D110.

In addition, when a negative voltage lower than ground is applied to the input signal terminal Vinp, a current flows from ground to the input signal terminal Vinp side via the diode D111 and the input termination resistor R100. Similarly, when a negative voltage lower than ground is applied to the input signal terminal Vinn, a current flows from ground to the input signal terminal Vinn side via a diode D111 and the input termination resistor R101.

Since the DC cut capacitors C100 and C101 exist in the sequence stage of the input termination resistors R100 and R101, a voltage exceeding the breakdown voltage is not applied to the transistor of the input buffer 101 of the driver circuit 100a.

In the driver circuit 100a of the present example, since the input termination resistors R100 and R101 exist between the diodes D110 and D111 of the ESD protection circuit 107 and the differential input signal terminals Vinp and Vinn, the influence of the parasitic capacitance added to the differential input signal terminals Vinp and Vinn becomes weaker than that of a conventional driver circuit, so that a frequency characteristic wider than that of the conventional driver circuit can be realized.

In the present example, the ESD protection circuit 108 is connected to the differential output signal terminals Voutp and Voutn, and an ESD protection circuit 109 is connected to the base terminals of the output transistors Q101 and Q103 of the output circuit 104a.

Figure 3A:
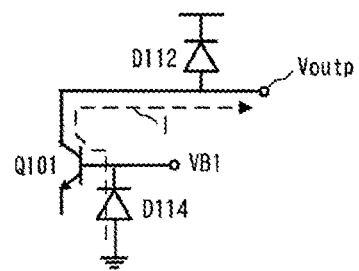
FIG. 3A and FIG. 3B are circuit diagrams for explaining the function of the ESD protection circuit of the driver circuit according to the first example of the present invention.
Figure 3B:
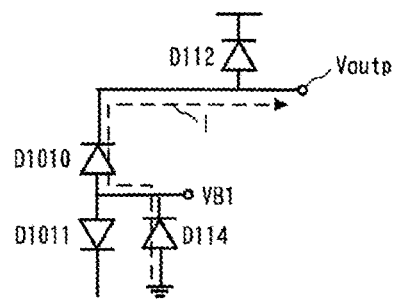

When a negative voltage lower than ground is applied to the output signal terminal Voutp, a current flows from ground to the output signal terminal Voutp side via the diode D114 as shown in FIG. 3A, so that a voltage equal to or higher than the breakdown voltage is prevented from being applied to the output transistor Q101 of the output circuit 104a. FIG. 3B is a diagram illustrating the output transistor Q101 of FIG. 3A by an equivalent circuit consisting of diodes D1010, D101.

Similarly, when a negative voltage lower than ground is applied to the output signal terminal Voutn, a current flows from ground to the output signal terminal Voutn side via a diode D115, so that the output transistor Q103 of the output circuit 104a is protected.

When a positive voltage higher than the power supply voltage VCC is applied to the output signal terminal Voutp, a current flows from the output signal terminal Voutp to the power supply voltage VCC side via a diode D112 of the ESD protection circuit 108 similarly to a conventional case, so that the output transistor Q101 is protected.

Similarly, when a positive voltage higher than the power supply voltage VCC is applied to the output signal terminal Voutn, a current flows from the output signal terminal Voutn to the power supply voltage VCC side via the diode D113 of the ESD protection circuit 108, so that the output transistor Q103 is protected.

In the present example, when a negative voltage lower than ground is applied to the differential output signal terminals Voutp and Voutn, a current flows between the base terminal and the collector terminal of the output transistor Q101 and Q103 of the output circuit 104. When a current exceeding a current capacity of the output transistors Q101 and Q103 flows, the output transistors Q101 and Q103 are broken.

However, the breakdown due to excessive voltage can be more easily generated than the breakdown of the output transistors Q101 and Q103 due to excessive current. The reason for this is that the current capacity of the transistor is as large as, for example, several Amperes, whereas the breakdown voltage of the transistor is, for example, several Volts, and the excessive voltage due to electro-static may become several hundred Volts. Therefore, in the present example, an excessive voltage can be prevented from being applied to the transistors within a range in which the transistors are not broken by an excessive current.

The parasitic capacitance of the diode D114 does not affect the output signal terminal Voutp (the collector terminal of the output transistor Q101) due to isolation characteristics between the base terminal and the collector terminal of the output transistor Q101. Similarly, the parasitic capacitance of the diode D115 does not affect the output signal terminal Voutn (the collector terminal of the output transistor Q103) due to the isolation characteristics between the base terminal and the collector terminal of the output transistor Q103. Therefore, the driver circuit 100a of the present example can realize frequency characteristics wider than before.

Further, in the present example, the parasitic capacitance of the diode D114 and D115 causes the base terminals of the output transistors Q101 and Q103 to be ground AC-wise, and an output impedance of the output circuit 104a can be increased, so that a synergy to suppress an oscillation is present.

Figure 4:
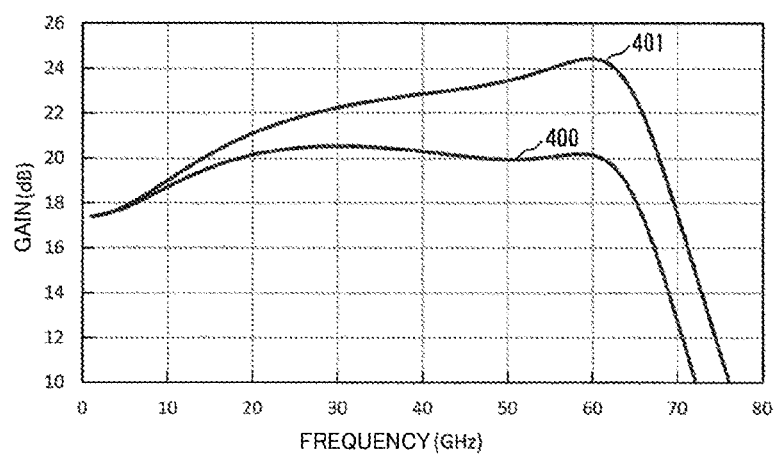
FIG. 4 is a diagram showing a simulation result of transmission characteristics of the driver circuit according to the first example of the present invention.
Figure 17:
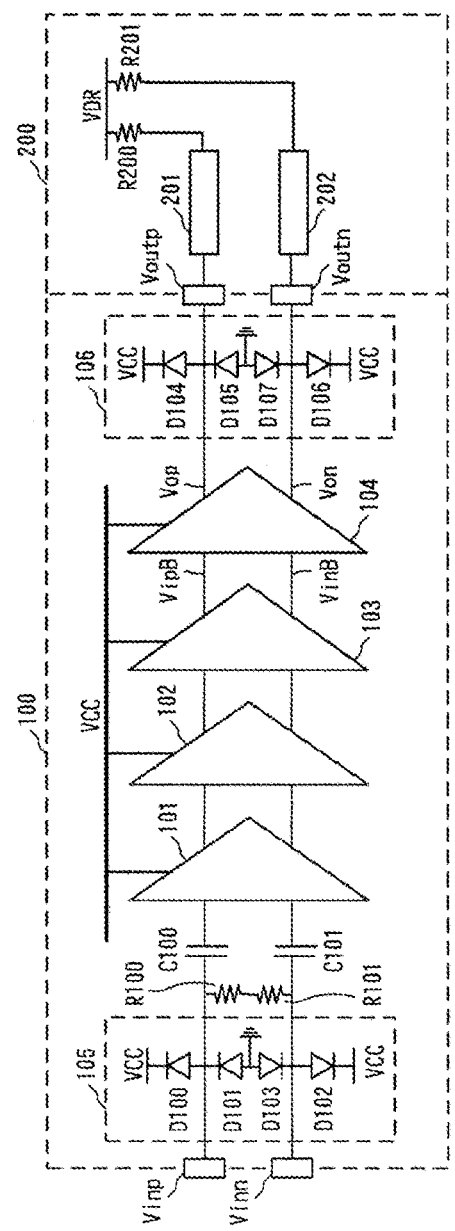
FIG. 17 is a circuit diagram showing a configuration of a conventional driver circuit.
Figure 18:
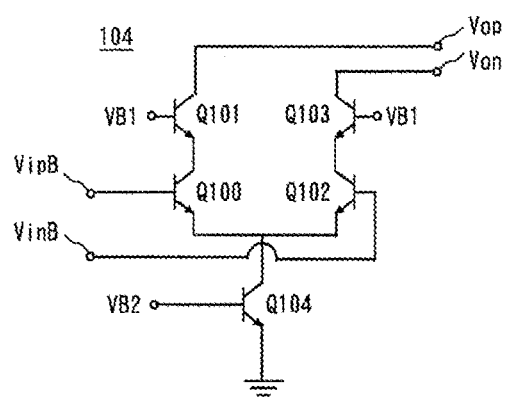
FIG. 18 is a circuit diagram showing a configuration of an output circuit of a conventional driver circuit.

FIG. 4 shows a simulation result of transmission characteristics of the conventional driver circuit 100 shown in FIG. 17 and the driver circuit 100a of the present example. In FIG. 4, 400 shows the transmission characteristics of the conventional driver circuit 100, and 401 shows the transmission characteristics of the driver circuit 100a of the present example. By using the configuration of the present example, it is confirmed that a wider band than the conventional one can be realized while realizing a breakdown voltage protection function against electro-static.

In the present example, the ESD protection circuit 107 and the ESD protection circuits 108 and 109 are provided simultaneously, but only the ESD protection circuit 107 may be provided or only the ESD protection circuits 108 and 109 may be provided.

Figure 5:
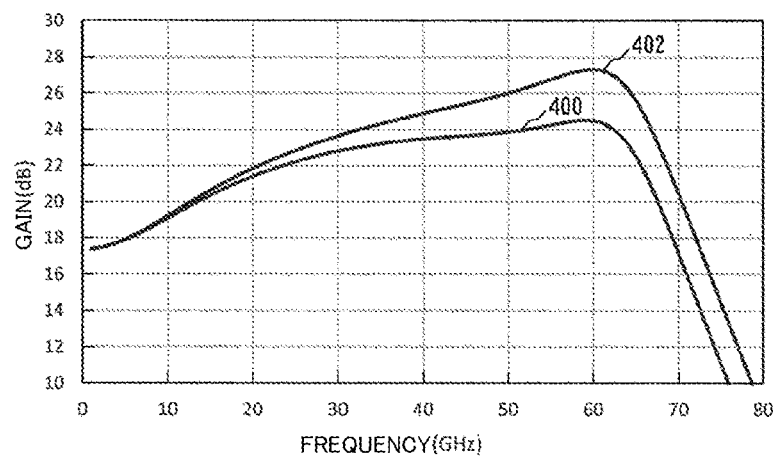
FIG. 5 is a diagram showing a simulation result of transmission characteristics of a configuration using a conventional output-side ESD protection circuit instead of the output-side ESD protection circuit in a driver circuit according to the first example of the present invention.

FIG. 5 shows a simulation result of the transmission characteristic of the driver circuit 100a of the present example using a conventional ESD protection circuit 106 instead of the ESD protection circuits 108 and 109. As in FIG. 4, reference numeral 400 denotes the transmission characteristic of the conventional driver circuit 100, and 402 denotes the transmission characteristic of a configuration in which an ESD protection circuit 106 is used instead of the ESD protection circuits 108 and 109. FIG. 5 shows that a wide band can be realized even when only the ESD protection circuit 107 is provided.

Figure 6:
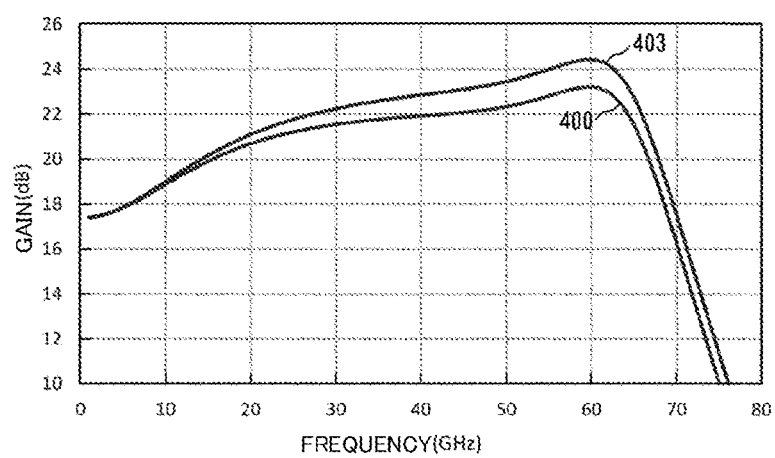
FIG. 6 is a diagram showing a simulation result of transmission characteristics of a configuration using a conventional input-side ESD protection circuit instead of an input-side ESD protection circuit in a driver circuit according to the first example of the present invention.

FIG. 6 shows a simulation result of transmission characteristics of a configuration using a conventional ESD protection circuit 105 instead of the ESD protection circuit 107 in the driver circuit 100a of the present example. Similarly to FIG. 4, 400 denotes the transmission characteristics of the conventional driver circuit 100, and 403 denotes the transmission characteristic of a configuration in which an ESD protection circuit 105 is used instead of the ESD protection circuit 107. FIG. 6 shows that a wide band can be realized even when only the ESD protection circuits 108 and 109 are provided.

Second Example

Figure 7:
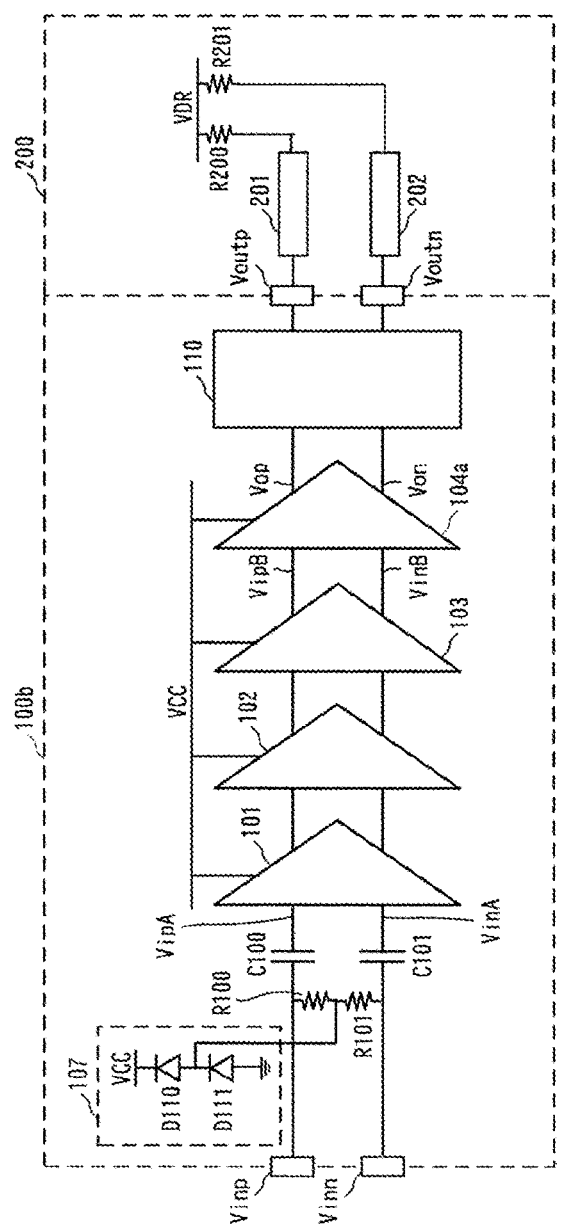
FIG. 7 is a circuit diagram showing a configuration of a driver circuit according to a second example of the present invention.

Next, a second example of the present invention will be described. FIG. 7 is a circuit diagram showing a configuration of a driver circuit according to the second example of the present invention. The driver circuit 100b of the present example includes an input buffer 101, a GCA 102, a preamplifier 103, an output circuit 104a, DC cut capacitors C100 and C101, input termination resistors R100 and R101, an ESD protection circuit 107, and an ESD protection circuit 110 connected between the output circuit 104a and differential output signal terminals Voutp, Voutn of the driver circuit 100b.

The configuration of the ESD protection circuit 107 and the configuration of the output circuit 104a including the ESD protection circuit 109 are as described in the first example.

Figure 8:
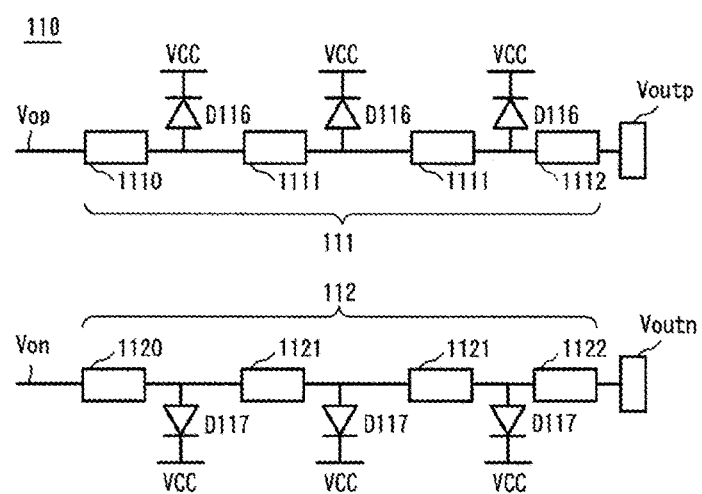
FIG. 8 is a circuit diagram showing a configuration of an ESD protection circuit on the output side of the driver circuit according to the second example of the present invention.

FIG. 8 is a circuit diagram showing a configuration of the ESD protection circuit 110. The ESD protection circuit 110 includes a transmission line 111 having an input end connected to a non-inverted output terminal Vop of the output circuit 104a and an output end connected to an output signal terminal Voutp on a positive phase side of a driver circuit 100b, a transmission line 112 having an input end connected to an inverted output terminal Von of the output circuit 104a and an output end connected to an output signal terminal Voutn on a negative phase side of the driver circuit 100b, a plurality of diodes D116 arranged along the transmission line 111 and having anodes connected to the transmission line 111, and cathodes connected to the power supply voltage VCC, and a plurality of diodes D117 arranged along the transmission line 112 and having anodes connected to the transmission line 112 and cathodes connected to the power supply voltage VCC.

The transmission line 111 has a configuration in which a plurality of transmission lines 1110, 1111, and 1112 are connected in series. The transmission line 1111 between the diodes D116 and the transmission line 1110 on the input side have different characteristic impedances. The reason for this is that in the case of the transmission line 1110, it is necessary to absorb the influence of the parasitic capacitance of the output circuit 104a or the like in the previous stage by the transmission line 1110. Similarly, the transmission lines 1111 and 1112 have different characteristic impedances. The reason for this is that in the case of the transmission line 1112, it is necessary to absorb the influence of the parasitic capacitance of the MZM 200 or the like of the transmission line 1112 in the subsequent stage.

The transmission line 112 has a configuration in which a plurality of transmission lines 1120, 1121, and 1122 are connected in series. The transmission line 1121 between the diodes D117 and the transmission line 1120 on the input side have different characteristic impedances. The reason for this is that in the case of the transmission line 1120, it is necessary to absorb the influence of the parasitic capacitance of the output circuit 104a or the like in the previous stage by the transmission line 1120. Similarly, the transmission lines 1121 and 1122 have different characteristic impedances. The reason for this is that in the case of the transmission line 1122, it is necessary to absorb the influence of the parasitic capacitance of the MZM 200 or the like of the transmission line 1122 in the subsequent stage.

In the ESD protection circuit 108 of the first example, diodes D112 and D113 having a large size (a current capacity) is used to satisfy the allowable breakdown voltage against electro-static. On the other hand, in the present example, the diode D112 is divided into diodes D116 of small size, and the total size (the total current capacity) of the diodes D116 is made equal to the size of the diode D112. Further, the diode D113 is divided into diodes D117 of a small size, and the total size of the diodes D117 is made equal to the size of the diode D113.

Then, a transmission line is connected before and after the diodes D116 and D117. The characteristic impedance of a pseudo transmission line composed of the transmission line 111 and the diode D116 and the characteristic impedance of a pseudo transmission line composed of the transmission line 112 and the diode D117 are made equal to the characteristic impedance of the MZM 200, so that multiple reflections of signals at a connection point between the driver circuit 100b and the MZM 200.

Since a cut-off frequency of the pseudo transmission line is basically determined by the parasitic capacitance of the diode connected to the transmission line per unit length, the size of the diode is reduced as much as possible, and a band of the driver circuit 100b can be widened as the number of diodes is increased. That is, when the number of each of the diodes D116 and D117 is N (N is an integer equal to or greater than 2), the size of each of the diodes D116 and D117 is determined to be 1/N of the size of the diodes D112 and D113.

However, when the loss of the transmission lines 111 and 112 is large, it is desirable that the loss of the transmission lines 111 and 112 is small because it is difficult to widen the band.

As in the present example, the combination of a configuration in which an influence of the diodes D116 and D117 connected to the power supply voltage VCC is reduced by the transmission lines 111 and 112 and a configuration an influence of the diodes D114 and D115 connected to ground is reduced by the output transistors Q101 and Q103 of the output circuit 104a has a synergy for widening the band of the driver circuit 100b. This is because the parasitic capacitance of the diode connected to the transmission line per unit length can be reduced and the cut-off frequency can be increased as described above.

Thus, in the present example, the band of the driver circuit 100b can be made wider than in the first example.

When a diode connected to the ground is incorporated in the pseudo transmission line like the ESD protection circuit 110, the parasitic capacitance becomes large and the cut-off frequency becomes low.

In the present example, the ESD protection circuit 107 and the ESD protection circuits 109 and 110 are provided simultaneously, but only the ESD protection circuit 109 and 110 may be provided.

Third Example

Figure 9:
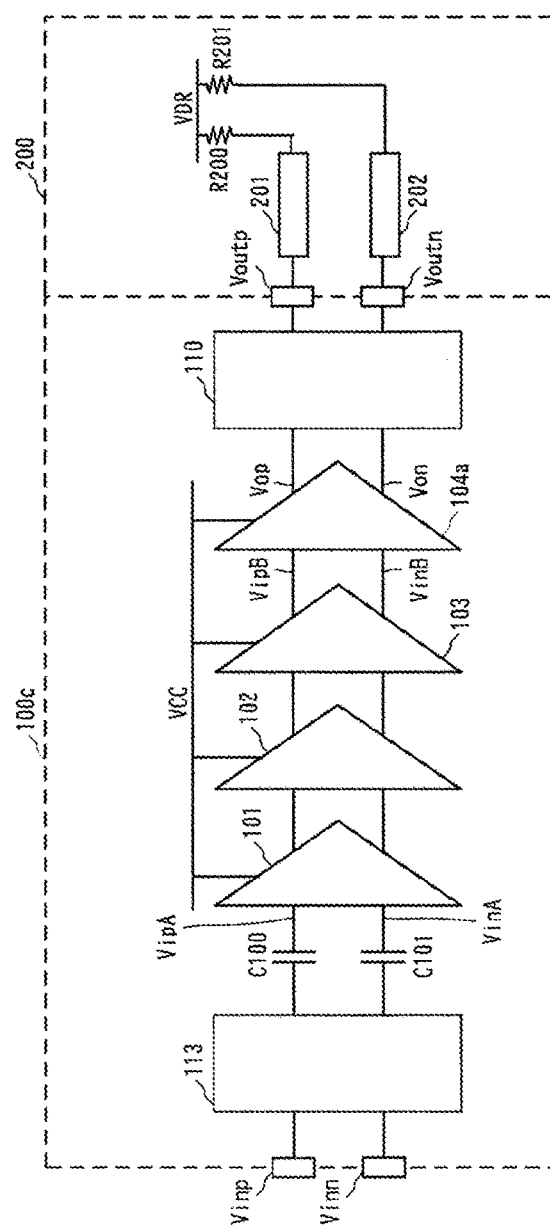
FIG. 9 is a circuit diagram showing a configuration of a driver circuit according to a third example of the present invention.

Next, a third example of the present invention will be described. FIG. 9 is a circuit diagram showing a configuration of a driver circuit according to the third example of the present invention. The driver circuit 100c of the present example includes an input buffer 101, a GCA 102, a preamplifier 103, an output circuit 104a, DC cut capacitors C100 and C101, an ESD protection circuit 110, and an ESD protection circuit 113 connected to differential input signal terminals Vinp and Vinn of the driver circuit 100c.

The configuration of the ESD protection circuit 110 and the configuration of the output circuit 104a including the ESD protection circuit 10 are as described in the first and second examples.

Figure 10:
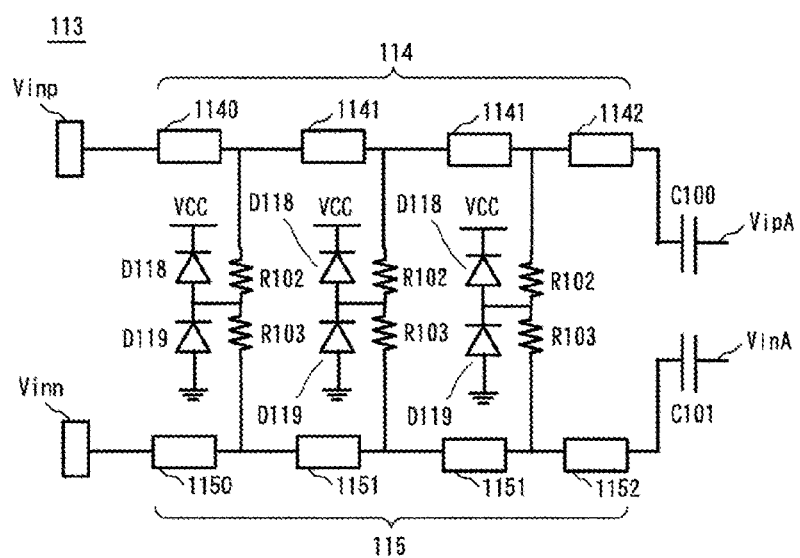
FIG. 10 is a circuit diagram showing a configuration of an ESD protection circuit on the input side of the driver circuit according to the third example of the present invention.

FIG. 10 is a circuit diagram showing a configuration of the ESD protection circuit 113. The ESD protection circuit 113 includes a transmission line 114 having an input end connected to an input signal terminal Vinp on the positive phase side of the driver circuit 100c and an output end connected to one end of the DC cut capacitor C100, a transmission line 115 having an input end connected to an input signal terminal Vinn on the negative phase side of the driver circuit 100c and an output end connected to one end of the DC cut capacitor C101, a plurality of input termination resistors R102 arranged along the transmission line 114 and having one end connected to the transmission line 114, a plurality of input termination resistors R103 arranged along the transmission line 115 and having one end connected to the transmission line 115 and another end connected to another end of the input termination resistor R102, a plurality of diodes D118 provided for each set of input termination resistors R102 and R103 connected in series and having anodes connected to a connection point of the input termination resistors R102 and R103 and cathodes connected to a power supply voltage VCC, and a plurality of diodes D119 provided for each diode D118 and having anodes connected to ground and cathodes connected to the anodes of the diode D118.

The transmission line 114 has a configuration in which a plurality of transmission lines 1140, 1141, and 1142 are connected in series. The transmission line 1141 between the input terminal resistors R102 and the transmission line 1140 on the input side have different characteristic impedances. The reason for this is that in the case of the transmission line 1140, it is necessary to absorb the influence of the parasitic capacitance of the circuit or the like in the previous stage by the transmission line 1140. Similarly, the transmission line 1141 and the transmission line 1142 have different characteristic impedances. The reason for this is that in the case of the transmission line 1142, it is necessary to absorb the influence of the capacitance of the DC cut capacitor C100 or the like in the subsequent stage by the transmission line 1142.

The transmission line 115 has a configuration in which a plurality of transmission lines 1150, 1151, and 1152 are connected in series. The transmission line 1151 between the input terminal resistors R103 and the transmission line 1150 on the input side have different characteristic impedances. The reason for this is that in the case of the transmission line 1150, it is necessary to absorb the influence of the parasitic capacitance of the circuit or the like in the previous stage by the transmission line 1150. Similarly, the transmission line 1151 and the transmission line 1152 have different characteristic impedances. The reason for this is that in the case of the transmission line 1152, it is necessary to absorb the influence of the capacitance of the DC cut capacitor C101 or the like in the subsequent stage by the transmission line 1152.

In the present example, in the configuration of the first and second examples, the influence of band deterioration caused by the diode of the ESD protection circuit connected to the differential input signal terminals Vinp and Vinn is further reduced. In the present example, the diode D110 of the ESD protection circuit 107 of the first and second examples is divided into diodes D118 of a small size, and the total size of the diode D118 (total current capacity) is equal to the size of the diode D110. The diode D111 of the ESD protection circuit 107 is divided into diodes D119 of a small size, and the total size of the diodes D119 is made equal to the size of the diode D111.

Then, a transmission line is connected before and after the diodes D118 and D119. The characteristic impedance of a pseudo transmission line composed of the transmission line 114, the diode D118, and the input termination resistor R102, and the characteristic impedance of a pseudo transmission line composed of the transmission line 115, the diode D119, and the input termination resistor R103 are set to 50Ω.

When the number of each of the diodes D118 and D119 is N (N is an integer of 2 or more), the size of each of the diodes D118 and D119 is set to 1/N of the size of the diode D110 and D111.

Further, the resistance values of the N input termination resistors R102 and the N input termination resistors R103 are set to N×50Ω.

As described above, in the driver circuit 100c of the present example, the influence of band deterioration caused by the diode of the ESD protection circuit on the input side can be further reduced, and a wider band can be achieved as compared with the first and second examples.

Although FIG. 9 shows an example in which the ESD protection circuit 113 of the present example is applied to the second example, the ESD protection circuit 113 may be applied to the first example. In other words, the ESD protection circuit 108 may be provided instead of the ESD protection circuit 110 in FIG. 9.

In the present example, the ESD protection circuit 113 and the ESD protection circuit 109 and 110 are provided simultaneously, but only the ESD protection circuit 113 may be provided.

Fourth Example

Figure 11:
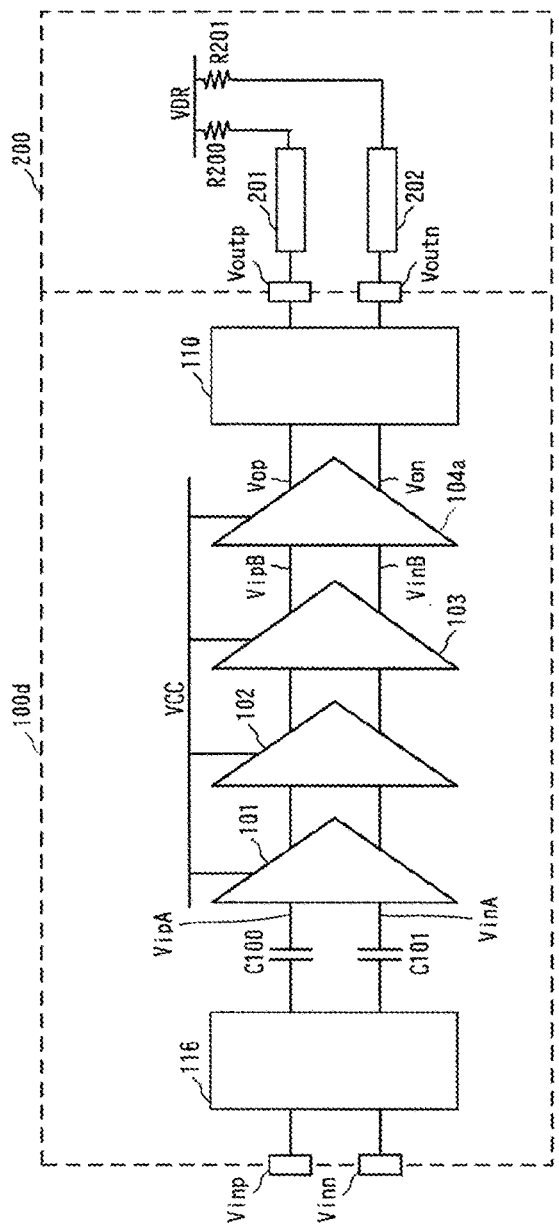
FIG. 11 is a circuit diagram showing a configuration of a driver circuit according to a fourth example of the present invention.

Next, a fourth example of the present invention will be described. FIG. 11 is a circuit diagram showing a configuration of a driver circuit according to the fourth example of the present invention. A driver circuit 100d of the present example includes an input buffer 101, a GCA 102, a pre-amplifier 103, an output circuit 104a, DC cut capacitors C100 and C101, an ESD protection circuit 110, and an ESD protection circuit 116 connected to differential input signal terminals Vinp and Vinn of the driver circuit 100d.

The configuration of the ESD protection circuit 110 and the configuration of the output circuit 104a including the ESD protection circuit 109 are as described in the first and second examples.

Figure 12:
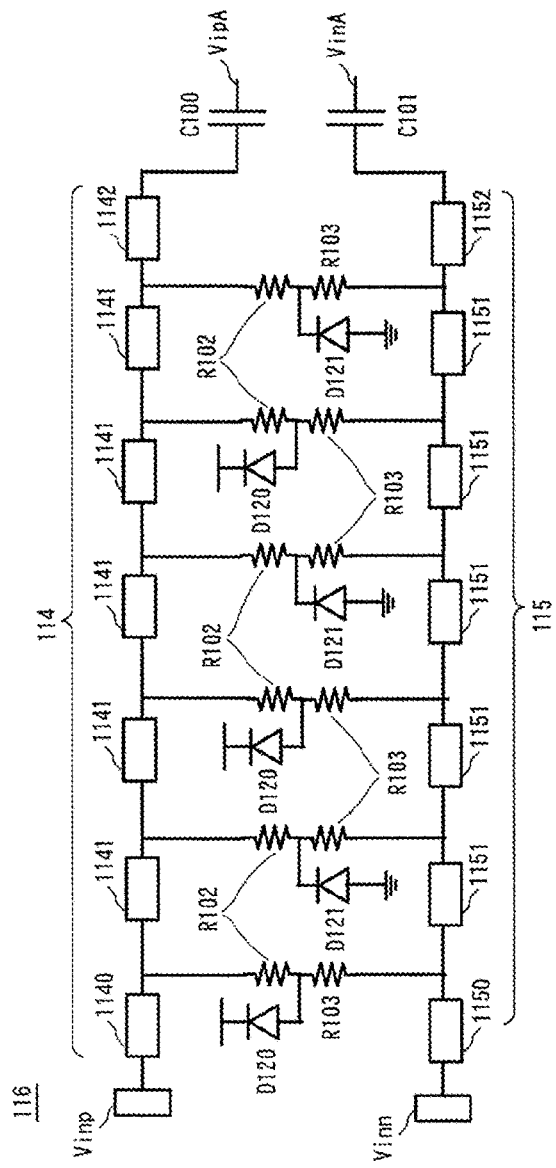
FIG. 12 is a circuit diagram showing a configuration of an ESD protection circuit on the input side of the driver circuit according to the fourth example of the present invention.

FIG. 12 is a circuit diagram showing a configuration of the ESD protection circuit 116. The ESD protection circuit 116 includes a transmission line 114 having an input end connected to an input signal terminal Vinp on the positive phase side of the driver circuit 100d and an output terminal connected to one end of the DC cut capacitor C100, a transmission line 115 having an input end connected to an input signal terminal Vinn on the negative phase side of the driver circuit 100d and an output terminal connected to one end of the DC cut capacitor C101, a plurality of input termination resistors R102 arranged along the transmission line 114 and having one end connected to the transmission line 114, a plurality of input termination resistors R103 arranged along the transmission line 115 and having one end connected to the transmission line 115 and another end connected to another end of the input termination resistor R102, a plurality of diodes D120 provided for every other set of a plurality of sets of input termination resistors R102 and R103 connected in series and having anodes connected to a connection point of the input termination resistors R102 and R103 and cathodes connected to a power supply voltage VCC, and a plurality of diodes D121 having anodes connected to ground and cathodes connected to a connection point of the input termination resistors R102 and R103 to which a diode D120 is not connected among a plurality of sets of the input termination resistors R102 and R103.

In the present example, in the configuration of the third example, the influence of band deterioration caused by the diode of the ESD protection circuit connected to the differential input signal terminals Vinp and Vinn is further reduced. In the present example, the diode D110 of the ESD protection circuit 107 of the first and second examples is divided into diodes D120 of a small size, so that the total size (the total current capacity) of the diodes D120 is equal to the size of the diode D110. A diode D111 of the ESD protection circuit 107 is divided into diodes D121 of a small size, and the total size of the diodes D121 is made equal to the size of the diode D111.

Further, in the present example, a unit cell in which the diode D120 is connected to the midpoint of the input termination resistors R102 and R103, and a unit cell in which a diode D121 is connected to the midpoint of the input termination resistor R102 and R103 are alternately arranged.

Then, the characteristic impedance of a pseudo transmission line composed of the transmission line 114, the diode D120, and the input termination resistor R102, and the characteristic impedance of a pseudo transmission line composed of the transmission line 115, the diode D121 and the input termination resistor R103 are set to 50Ω.

When the total number of the diodes D120 and D121 is N (N is an integer of 2 or more), the size of each of the diodes D120 and D121 is set to 2/N of the size of the diodes D110 and D111.

Further, the resistance values of the N input termination resistors R102 and the N input termination resistors R103 are set to N×50Ω.

As described above, in the driver circuit 100*d* of the present example, the parasitic capacitance of the diode connected to the transmission line per unit length can be reduced and the cut-off frequency can be increased, so that a wider band can be achieved as compared with the third example.

Although FIG. 11 shows an example in which the ESD protection circuit 116 of the present example is applied to the second example, the ESD protection circuit 116 may be applied to the first example. In other words, the ESD protection circuit 108 may be provided instead of the ESD protection circuit 110 in FIG. 11.

In the present example, the ESD protection circuit 116 and the ESD protection circuits 109 and 110 are provided simultaneously, but only the ESD protection circuit 116 may be provided.

Fifth Example

Figure 13:
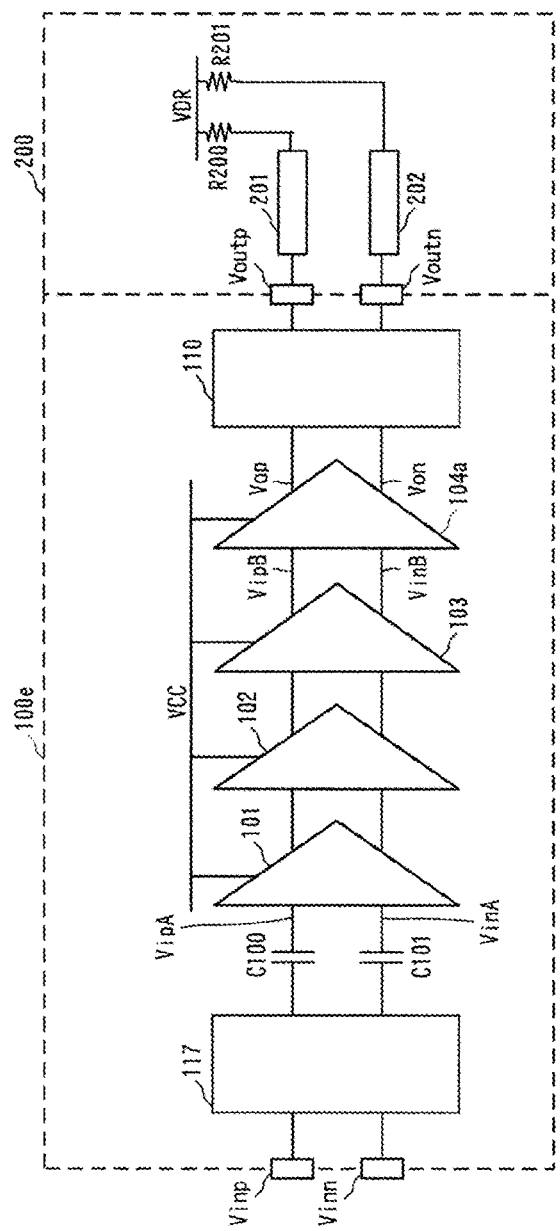
FIG. 13 is a circuit diagram showing a configuration of a driver circuit according to a fifth example of the present invention.

Next, a fifth example of the present invention will be described. FIG. 13 is a circuit diagram showing a configuration of a driver circuit according to the fifth example of the present invention. The driver circuit 100*e* of the present example includes an input buffer 101, a GCA 102, a preamplifier 103, an output circuit 104*a*, DC cut capacitors C100 and C101, an ESD protection circuit 110, and an ESD protection circuit 117 connected to differential input signal terminals Vinp and Vinn of the driver circuit 100*e*.

The configuration of the ESD protection circuit 110 and the configuration of the output circuit 104*a* including the ESD protection circuit 109 are as described in the first and second examples.

Figure 14:
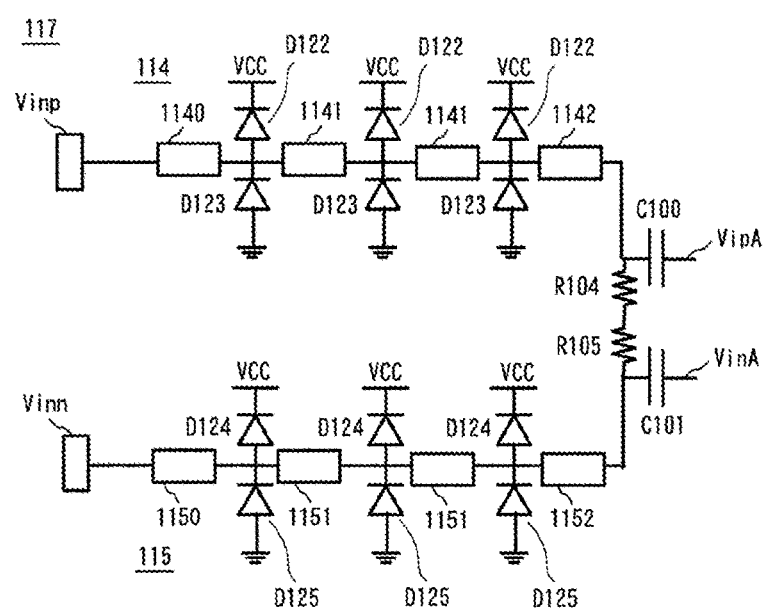
FIG. 14 is a circuit diagram showing a configuration of an ESD protection circuit on the input side of a driver circuit according to the fifth example of the present invention.

FIG. 14 is a circuit diagram showing a configuration of the ESD protection circuit 117. The ESD protection circuit 117 includes a transmission line 114 having an input connected to an input signal terminal Vinp on the positive phase side of the driver circuit 100*e* and an output end connected to one end of the DC cut capacitor C100, a transmission line 115 having an input end connected to an input signal terminal Vinn on the negative phase side of the driver circuit 100*e* and an output end connected to one end of the DC cut capacitor C101, two input termination resistors R104 and R105 connected in series between the output end of the transmission line 114 and the output end of the transmission line 115, a plurality of diodes D122 arranged along the transmission line 114 and having anodes connected to the transmission line 114 and cathodes connected to a power supply voltage VCC, a plurality of diodes D123 provided for each diode D122 and having anodes connected to ground and cathodes connected to the anodes of the diodes D1, a plurality of diodes D124 arranged along the transmission line 115 and having anodes connected to the transmission line 115 and cathodes connected to the power supply voltage VCC, and a plurality of diodes D125 provided for each of the diodes D124 and having anodes connected to ground and cathodes connected to the anodes of the diodes D124.

Depending on the current capacity of the input termination resistor, it is preferable to connect the diode of the ESD protection circuit on the input side to the differential input signal terminals Vinp and Vinn of the driver circuit instead of the middle point of the input termination resistor. However, as described with respect to the conventional driver circuit, there is a problem that the band of the driver circuit is deteriorated due to the parasitic capacitance of the diode.

In the present example, the diode D110 of the ESD protection circuit 107 of the first and second examples is divided into diodes D122 and D124 of a small size, and the total size of the diode D122 and the total size of the diode D124 are made equal to the size of the diode D110, respectively. The diode D111 of the ESD protection circuit 107 is divided into diodes D123 and D125 of a small size, and the total size of the diodes D123 and D125 are made equal to the size of the diode D111, respectively.

Then, the characteristic impedance of a pseudo transmission line composed of the transmission line 114 and the diodes D122 and D123, and the characteristic impedance of a pseudo transmission line composed of the transmission line 115 and the diodes D124 and D125 are set to 50Ω.

When the number of the diodes D122 to D125 is N (N is an integer equal to or larger than 2), the size of each of the diodes D122 to D125 is set to 1/N of the size of the respective diodes D110 and D111.

Further, the resistance value of each of the input termination resistors R104 and R105 is set to 50Ω.

Thus, in the present example, band deterioration of the driver circuit due to parasitic capacitance of the diode of the ESD protection circuit on the input side can be prevented.

Although FIG. 13 shows an example in which the ESD protection circuit 117 of the present example is applied to the second example, the ESD protection circuit 117 may be applied to the first example. That is, in FIG. 13, an ESD protection circuit 108 may be provided instead of the ESD protection circuit 110.

In the present example, the ESD protection circuit 117 and the ESD protection circuits 109 and 110 are provided simultaneously, but only the ESD protection circuit 117 may be provided.

Sixth Example

Figure 15:
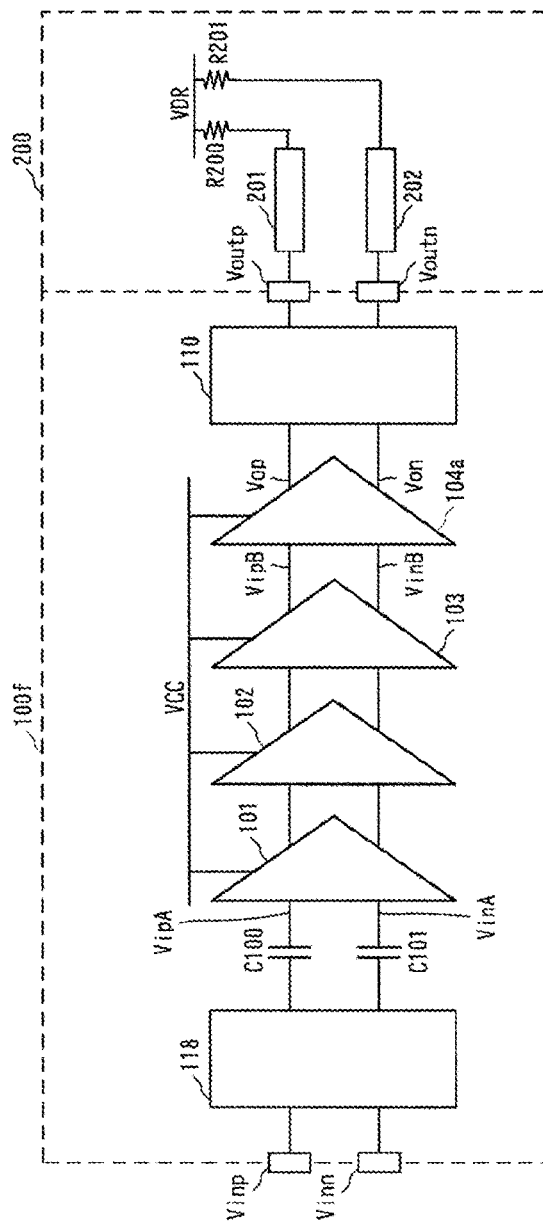
FIG. 15 is a circuit diagram showing a configuration of a driver circuit according to a sixth example of the present invention.

Next, the sixth example of the present invention will be described. FIG. 15 is a circuit diagram showing a configuration of a driver circuit according to the sixth example of the present invention. The driver circuit 100*f* of the present example includes an input buffer 101, a GCA 102, a preamplifier 103, an output circuit 104*a*, DC cut capacitors C100 and C101, an ESD protection circuit 110, and an ESD protection circuit 118 connected to differential input signal terminals Vinp and Vinn of the driver circuit 100*f*.

The configuration of the ESD protection circuit 110 and the configuration of the output circuit 104*a* including the ESD protection circuit 109 are as described in the first and second examples.

Figure 16:
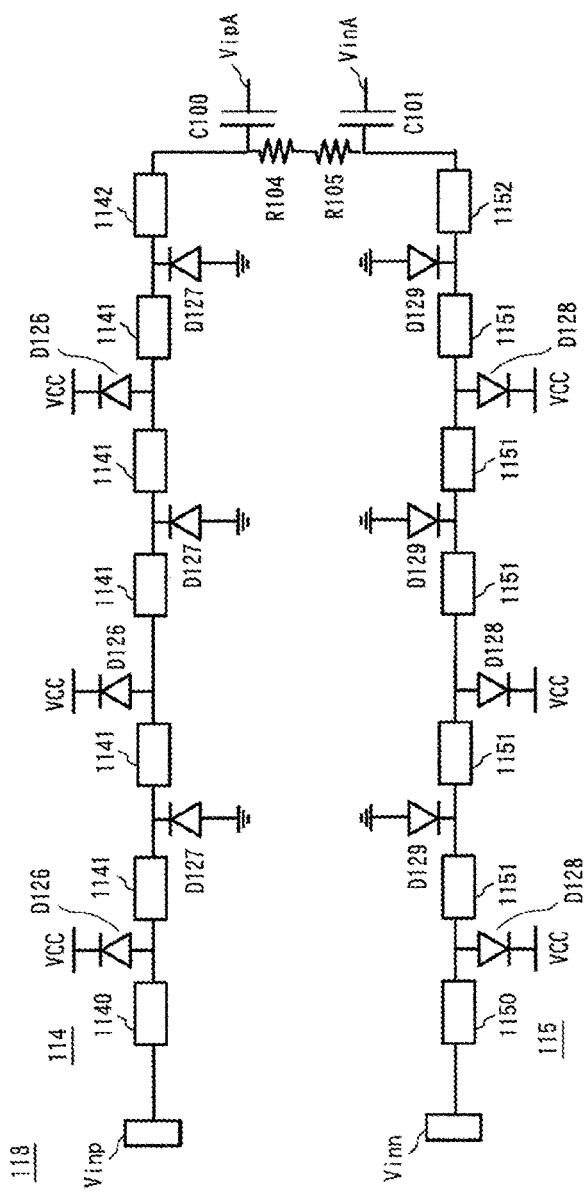
FIG. 16 is a circuit diagram showing a configuration of an ESD protection circuit on the input side of a driver circuit according to a sixth example of the present invention.

FIG. 16 is a circuit diagram showing a configuration of the ESD protection circuit 118. The ESD protection circuit 118 includes a transmission line 114 having an input end connected to an input signal terminal Vinp on the positive phase side of the driver circuit 100*f* and an output end connected to one end of the DC cut capacitor C100, a transmission line 115 having an input end connected to an input signal terminal Vinn on the negative phase side of the driver circuit 100f and an output end connected to one end of the DC cut capacitor C101, two input termination resistors R104 and R105 connected in series between the output end of the transmission line 114 and the output end of the transmission line 115, a plurality of diodes D126 arranged along the transmission line 114 and having anodes connected to the transmission line 114 and cathodes connected to a power supply voltage VCC, a plurality of diodes D127 arranged along the transmission line 114 and having anodes connected to ground and cathodes connected to the transmission line 114, a plurality of diodes D128 arrange along the transmission line 115 and having anodes connected to the transmission line 115 and cathodes connected to the power supply voltage VCC, and a plurality of diodes D129 arranged along the transmission line 115 and having anodes connected to ground and cathodes connected to the transmission line 115.

In the present example, in the configuration of the fifth example, the influence of band deterioration caused by the diode of the ESD protection circuit connected to the differential input signal terminals Vinp and Vinn is further reduced. In the present example, the diode D110 of the ESD protection circuit 107 of the first and second examples is divided into diodes D126 and D128 of a small size, and the total size of the diode D126 and the total size of the diode D128 are made equal to the size of the diode D110, respectively. The diode D111 of the ESD protection circuit 107 is divided into diodes D127 and D129 of a small size, and the total size of the diode D127 and the total size of the diode D129 are made equal to the size of the diode D111.

Further, in the present example, the diodes D126 and D127 are alternately arranged so that the diodes D126 and D127 are connected to different points of the transmission line 114. Similarly, the diodes D128 and D129 are alternately arranged so that the diodes D128 and D129 are connected to different points of the transmission line 115.

Then, the characteristic impedance of a pseudo transmission line composed of the transmission line 114 and the diodes D126 and D127, and the characteristic impedance of a pseudo transmission line composed of the transmission line 115 and the diodes D128 and D129 are set to 50Ω.

When the total number of the diodes D126 and D127 is N (N is an integer of 2 or more), and the total number of the diodes D128 and D129 is N, the size of each of the diodes D126 and D129 is set to 2/N of the size of the diode D110 and D111.

Further, the resistance value of each of the input termination resistors R104 and R105 is set to 50Ω.

As described above, in the driver circuit 100 F of the present example, the parasitic capacitance of the diode connected to the transmission line per unit length can be reduced and the cut-off frequency can be increased, so that a wider band can be achieved as compared with the fifth example.

Although FIG. 15 shows an example in which the ESD protection circuit 118 of the present example is applied to the second example, the ESD protection circuit 118 may be applied to the first example. That is, in FIG. 15, an ESD protection circuit 108 may be provided instead of the ESD protection circuit 110.

In the present example, the ESD protection circuit 118 and the ESD protection circuit 109 and 110 are provided simultaneously, but only the ESD protection circuit 118 may be provided.

INDUSTRIAL APPLICABILITY

Embodiments of the present invention can be applied to techniques for a driver circuit for driving an optical modulator.

REFERENCE SIGNS LIST 100a to 100f Driver circuit
101 Input buffer
102 Gain control amplifier
103 Preamplifier
104a Output circuit
107 to 110, 113, 116 to 118 ESD protection circuit
111, 112, 114, 115, 1110, 1111, 1112, 1120, 1121, 1122, 1140, 1141, 1142, 1150, 1151, 1152 Transmission line
Q100 to Q104 Transistor
D110 to D129 Diode
C100, C101 DC cut capacitor
R100 to R105 Input termination resistor.

The invention claimed is:

1. A driver circuit comprising:
a first input signal terminal;
a second input signal terminal;
an Electro-Static Discharge protection circuit connected to the first input signal terminal and the second input signal terminal;
a first capacitor and a second capacitor each having a first end connected to the Electro-Static Discharge protection circuit; and
an input buffer having a first input terminal and an inverting input terminal, the first input terminal of the input buffer being connected to a second end of the first capacitor and the inverting input terminal connected to a second end of the second capacitor of the input buffer, wherein the Electro-Static Discharge protection circuit includes:
a plurality of first diodes each having a cathode connected to a power supply voltage;
a plurality of second diodes each having anodes connected to ground;
a first transmission line having an input end connected to the first input signal terminal and an output end connected to the first end of the first capacitor;
a second transmission line having an input end connected to the second input signal terminal and an output end connected to the first end of the second capacitor;
a plurality of first input termination resistors arranged along the first transmission line and having a first end connected to the first transmission line; and
a plurality of second input termination resistors arranged along the second transmission line and having a first end connected to the second transmission line and a second end connected to a second end of the first input termination resistor.

2. The driver circuit according to claim 1, wherein:
the plurality of first input termination resistors is connected in series with the plurality of second input termination resistors with a one-to-one correspondence to provide a plurality of pairs of input termination resistors;
a first diode of the plurality of first diodes is provided for each of the plurality of pairs of input termination resistors, and each of the plurality of first diodes has an anode connected to a connection point of a corresponding first input termination resistor of the plurality of first input termination resistors and a corresponding second input termination resistor of the plurality of second input termination resistors; and a second diode of the plurality of second diodes is provided for each of the plurality of first diodes, and each of the plurality of second diodes has a cathode connected to an anode of a corresponding first diode of the plurality of first diodes.

3. The driver circuit according to claim 1, wherein:

the plurality of first input termination resistors is arranged along the first transmission line and has a first end connected to the first transmission line;

the plurality of second input termination resistors is arranged along the second transmission line and has a first end connected to the second transmission line and a second end connected to a second end of the plurality of first input termination resistors;

the plurality of first input termination resistors is connected in series with the plurality of second input termination resistors with a one-to-one correspondence to provide a plurality of pairs of input termination resistors;

a first diode of the plurality of first diodes is provided for every other pair of the plurality of pairs of input termination resistors, and each of the plurality of first diodes has an anode connected to a connection point of a corresponding first input termination resistor of the plurality of first input termination resistors and a corresponding second input termination resistor of the plurality of second input termination resistors; and each of the plurality of second diodes has an anode connected to a connection point of a corresponding first input termination resistor of the plurality of first input termination resistors and a corresponding second input termination resistor of the plurality of second input termination resistors that are not connected to the plurality of first diodes.

4. A driver circuit comprising:

a first output signal terminal;

a second output signal terminal;

an output circuit having a first output terminal connected to the first output signal terminal and a second output terminal connected to the second output signal terminal;

a first Electro-Static Discharge protection circuit connected to the first output signal terminal and the second output signal terminal, wherein the output circuit includes:

a first transistor and a second transistor each having a base terminal to which a differential signal is input;

a third transistor having a collector terminal connected to the first output signal terminal and an emitter terminal connected to a collector terminal of the first transistor; and a fourth transistor having a collector terminal connected to the second output signal terminal and an emitter terminal connected to the collector terminal of the second transistor; and a second Electro-Static Discharge protection circuit connected to a base terminal of the third transistor and a base terminal of the fourth transistor, wherein the second Electro-Static Discharge protection circuit includes:

a first diode having an anode connected to ground and a cathode connected to the base terminal of the third transistor; and a second diode having an anode connected to ground and a cathode connected to the base terminal of the fourth transistor.

5. The driver circuit according to claim 4, wherein the first Electro-Static Discharge protection circuit includes:

a third diode having an anode connected to the first output signal terminal and a cathode connected to a power supply voltage; and a fourth diode having an anode connected to the second output signal terminal and a cathode connected to the power supply voltage.

6. The driver circuit according to claim 5, wherein the output circuit includes:

the first transistor having a base terminal connected to a non-inverting input terminal of the output circuit;

the second transistor having a base terminal connected to an inverting input terminal of the output circuit;

the third transistor having a base terminal connected to a first bias voltage, a collector terminal connected to the first output signal terminal, and an emitter terminal connected to a collector terminal of the first transistor;

the fourth transistor having a base terminal connected to the first bias voltage, a collector terminal connected to the second output signal terminal, and an emitter terminal connected to a collector terminal of the second transistor;

a fifth transistor having a base terminal connected to a second bias voltage, a collector terminal connected to emitter terminals of the first and second transistors, and an emitter terminal connected to ground; and the second Electro-Static Discharge protection circuit.

7. The driver circuit according to claim 4, wherein the first Electro-Static Discharge protection circuit is arranged between the first output signal terminal and the second output signal terminal, and includes:

a first transmission line having an input end connected to a non-inverted output terminal and an output terminal connected to the first output signal terminal of the output circuit;

a second transmission line having an input end connected to an inverted output terminal and an output end connected to the second output signal terminal of the output circuit;

a plurality of third diodes arranged along the first transmission line and having anodes connected to the first transmission line and having cathodes connected to a power supply voltage; and a plurality of second diodes arranged along the second transmission line and having anodes connected to the second transmission line and having cathodes connected to the power supply voltage.

8. The driver circuit according to claim 7, wherein the output circuit includes:

the first transistor having a base terminal connected to a non-inverted input terminal of the output circuit;

the second transistor having a base terminal connected to an inverted input terminal of the output circuit;

the third transistor having a base terminal connected to a first bias voltage, a collector terminal connected to the first output signal terminal, and an emitter terminal connected to a collector terminal of the first transistor;

the fourth transistor having a base terminal connected to the first bias voltage, a collector terminal connected to the second output signal terminal, and an emitter terminal connected to a collector terminal of the second transistor;

a fifth transistor having a base terminal connected to a second bias voltage, a collector terminal connected to emitter terminals of the first and second transistors, and an emitter terminal connected to ground; and the second Electro-Static Discharge protection circuit.

\* \* \* \* \*